(12) United States Patent
Xue et al.

(10) Patent No.: US 11,187,731 B2
(45) Date of Patent: Nov. 30, 2021

(54) POWER GLITCH SIGNAL DETECTION CIRCUIT, SECURITY CHIP AND ELECTRONIC APPARATUS

(71) Applicant: SHENZHEN GOODIX TECHNOLOGY CO., LTD., Shenzhen (CN)

(72) Inventors: Jianfeng Xue, Shenzhen (CN); Jiang Yang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/025,788

(22) Filed: Sep. 18, 2020

(65) Prior Publication Data
US 2021/0048455 A1 Feb. 18, 2021

Related U.S. Application Data

(63) Continuation of application No. PCT/CN2019/100864, filed on Aug. 15, 2019.

(51) Int. Cl.
*G01R 19/165* (2006.01)
*H03K 5/1252* (2006.01)
*G01R 31/40* (2020.01)

(52) U.S. Cl.
CPC .......... *G01R 19/165* (2013.01); *G01R 31/40* (2013.01); *H03K 5/1252* (2013.01)

(58) Field of Classification Search
CPC .. G01R 19/165; G01R 31/40; G01R 31/2856; G01R 19/16538; G01R 19/2513; H03K 5/1252

USPC .................................................... 324/764.01
See application file for complete search history.

(56) References Cited

U.S. PATENT DOCUMENTS

| | | | |
|---|---|---|---|
| 4,413,284 A | 11/1983 | Izumita et al. | |
| 6,085,342 A | 7/2000 | Marholev et al. | |
| 6,751,079 B2 | 6/2004 | Bretschneider | |
| 10,156,595 B2 | 12/2018 | Nirwan et al. | |
| 2008/0061843 A1 | 3/2008 | Yanci | |
| 2018/0164351 A1* | 6/2018 | Nirwan | G01R 19/25 |

FOREIGN PATENT DOCUMENTS

| | | |
|---|---|---|
| CN | 101943728 A | 1/2011 |
| CN | 101943729 B | 3/2012 |
| CN | 103034804 A | 4/2013 |

(Continued)

*Primary Examiner* — Tung X Nguyen
*Assistant Examiner* — Robert P Alejnikov, Jr.

(57) ABSTRACT

A power glitch signal detection circuit, a security chip and an electronic apparatus are disclosed. The power glitch signal detection circuit includes: a voltage sampling module configured to acquire and output a sampled voltage of a power supply voltage; a detection unit array, including multiple MOS transistors with various threshold voltages, wherein first terminals of the multiple MOS transistors are connected to the sampled voltages, and second terminals of the multiple MOS transistors are connected to the power supply voltage; a switch array, including multiple switches corresponding to the multiple MOS transistors; and a signal generation circuit, wherein drain terminals of the multiple MOS transistors are connected to the signal generation circuit through the multiple switches respectively.

20 Claims, 4 Drawing Sheets

(56) References Cited

FOREIGN PATENT DOCUMENTS

| | | |
|---|---|---|
| CN | 103675421 A | 3/2014 |
| CN | 104459564 A | 3/2015 |
| CN | 104714193 A | 6/2015 |
| CN | 103034804 B | 12/2015 |
| CN | 104459564 B | 9/2017 |
| CN | 108169694 A | 6/2018 |
| EP | 0056738 A2 | 7/1982 |

* cited by examiner

POWER GLITCH SIGNAL DETECTION CIRCUIT, SECURITY CHIP AND ELECTRONIC APPARATUS

CROSS REFERENCE TO RELATED APPLICATIONS

The present application is a continuation of international application No. PCT/CN2019/100864, filed on Aug. 15, 2019, which is hereby incorporated by reference in its entirety.

TECHNICAL FIELD

Embodiments of the present disclosure relate to the field of electronic technologies, and in particular, to a power glitch signal detection circuit, a security chip and an electronic apparatus.

BACKGROUND

A security chip can be used to implementation functions such as user identification and key data storage, which is widely used in a financial field, is a key target of an attacker.

The attacker may make the chip work in an abnormal state by a fault attack (such as a power glitch attack), which leads to a wrong operation of the chip. At this point, the attacker can easily obtain confidential data in the security chip using a fault analysis technology. Under normal conditions, a power glitch signal detection circuit can detect a power glitch on power supply voltage (or ground voltage), and give an alarm signal in time, thereby increasing the robustness and safety of the system on chip.

However, the power glitch signal detection circuit in prior art could only implement simple detection of a power glitch signal, but could not detect a power glitch signal with a specific amplitude, which is of poor applicability. In addition, the power glitch signal detection circuit in prior art could not adjust a detection range of a power glitch signal, which is of poor sensitivity.

SUMMARY

Embodiments of the present application provides a power glitch signal detection circuit, a security chip and an electronic apparatus, which could improve applicability and sensitivity of the power glitch signal detection circuit.

In a first aspect, a power glitch signal detection circuit is provided, comprising:

a voltage sampling module, configured to acquire and output a sampling voltage of a power supply voltage;

a detection unit array, including multiple metal oxide semiconductor MOS transistors with different threshold voltages, wherein first terminals of the multiple MOS transistors are connected to the sampling voltage, and second terminals of the multiple MOS transistors are connected to a power supply voltage;

a switch array, including multiple switches corresponding to the multiple MOS transistors; and a signal generation circuit, wherein drain terminals of the multiple MOS transistors are connected to the signal generation circuit by the multiple switches respectively;

wherein when a target switch in the multiple switches is turned on and switches in the multiple switches other than the target switch are turned off, the signal generation circuit is configured to generate and output a target signal according to change of a voltage value of an output terminal of the target switch, and the target signal is used to indicate whether there is a power glitch signal on the power supply voltage or the ground voltage.

Because the multiple MOS transistors in the detection unit array have different threshold voltages, the power glitch signal detection circuit could detect whether there is a power glitch signal on the power supply voltage and whether there is a power glitch signal on the ground voltage by the detection unit array and the switch array, based on different threshold voltages. That is to detect a power glitch signal with a specific amplitude by choosing different MOS transistors, thereby improving the applicability and sensitivity of the power glitch signal detection circuit.

In addition, the MOS transistors with different threshold voltages in the detection unit array share the sampling voltage outputted by the voltage sampling module, which can reduce device overhead and chip area, thereby reducing the cost. In addition, the power glitch detection circuit can be compatible with a digital (Complementary Metal-Oxide-Semiconductor Transistor, CMOS) process, which can enhance the portability of the glitch signal detection circuit.

In conclusion, the power glitch signal detection circuit could detect a power glitch on the power supply voltage or the ground voltage, and the power glitch signal detection circuit has the advantages of high applicability, high sensitivity, low cost and strong portability.

In some possible implementation manners, the multiple MOS transistors comprise:

multiple first MOS transistors,

Wherein a first terminal of the first MOS transistor is a gate terminal of the first MOS transistor, and a second terminal of the first MOS transistor is a source terminal of the first MOS transistor.

In some possible implementation manners, the switch array comprises:

multiple second MOS transistors, wherein source terminals of the multiple second MOS transistors are connected to drain terminals of the multiple first MOS transistors respectively, and drain terminals of the multiple second MOS transistors are connected to the signal generation circuit;

a gate terminal of a target MOS transistor in the multiple second MOS transistors is configured to receive the ground voltage; and Gate terminals of MOS transistors in the multiple second MOS transistors other than the target MOS transistor are configured to receive the power supply voltage.

In some possible implementation manners, the multiple MOS transistors comprise:

multiple third MOS transistors,

Wherein a first terminal of the third MOS transistor is a source terminal of the third MOS transistor, and a second terminal of the third MOS transistor is a gate terminal of the third MOS transistor.

In some possible implementation manners, the switch array comprises:

multiple fourth MOS transistors, wherein source terminals of the multiple fourth MOS transistors are connected to drain terminals of the multiple third MOS transistors respectively, and drain terminals of the multiple fourth MOS transistors are connected to the signal generation circuit;

a gate terminal of a target MOS transistor in the multiple fourth MOS transistors is configured to receive the ground voltage; and Gate terminals of MOS transistors in the multiple fourth MOS transistors other than the target MOS transistor are configured to receive the power supply voltage or the sampling voltage.

In some possible implementation manners, the switch array comprises:

multiple fifth MOS transistors, wherein source terminals of the multiple fifth MOS transistors are configured to receive the power supply voltage, and drain terminals of the multiple fifth MOS transistors are connected to source terminals of the multiple fourth MOS transistors;

a gate terminal of a target MOS transistor in the multiple fifth MOS transistors is configured to receive the power supply voltage; and Gate terminals of MOS transistors in the multiple fifth MOS transistors other than the target MOS transistor are configured to receive the ground voltage.

In some possible implementation manners, the voltage sampling module comprises:

a first capacitor and a sixth MOS transistor,

Wherein a gate terminal of the sixth MOS transistor is connected to the ground voltage through the first capacitor, and a source terminal of the sixth MOS transistor is connected to the ground voltage.

In some possible implementation manners, the voltage sampling module further comprises:

a seventh MOS transistor, an eight MOS transistor and a first inverter, wherein the gate terminal of the sixth MOS transistor is connected to the power supply voltage through the seventh MOS transistor, a drain terminal of the sixth MOS transistor is connected to the ground voltage through the eighth MOS transistor, and the drain terminal of the sixth MOS transistor is connected to the gate terminal of the sixth MOS transistor through the first inverter.

In some possible implementation manners, the voltage sampling module comprises:

a resistor and a second capacitor,

Wherein a terminal of the capacitor is connected to the power supply voltage, and another terminal of the capacitor is connected to the ground voltage through the second capacitor.

In some possible implementation manners, the signal generation circuit is a D trigger.

In a second aspect, a security chip is provided, including the power glitch signal detection circuit provided in the first aspect or any possible implementation manners of the first aspect.

In a third aspect, an electronic apparatus is provided, comprising:

The security chip provided in the second aspect, and a processor, wherein the processor is configured to receive a target signal sent by the security ship, and the target signal is used to indicate whether there is a power glitch signal on the power supply voltage or the ground voltage.

DESCRIPTION OF EMBODIMENTS

Technical solutions of embodiments of the present application is hereinafter described with reference to the accompanying drawings.

A power glitch attack affects certain circuit units of a chip by quickly changing a power supply voltage (or a ground voltage) inputted to the chip, which causes one or more circuit units to enter an error state, then makes a processor in the chip skip an operation or perform a wrong operation according to the error state, and further exposes hidden security information in the chip.

Among them, a power signal may be a regular or irregular pulse signal or spike signal included in an input waveform in a circuit. For example, a voltage value when there is a positive power glitch signal on a power supply voltage equals to a voltage value when there is no positive power glitch signal on the power supply voltage plus a voltage value of the power glitch signal. Again, for example, a voltage value when there is a negative power glitch signal on a power supply voltage equals to a voltage value when there is no power glitch signal on the power supply voltage minus a voltage value of the power glitch signal.

Similarly, a positive power glitch signal and a negative power glitch signal may also occur on a ground voltage.

As for an unstable power supply voltage, it can also be considered as a voltage of a stable power supply voltage plus a power glitch signal; as for an unstable ground voltage, it can also be considered as a voltage of a stable ground voltage plus a power glitch signal.

Figure 1:
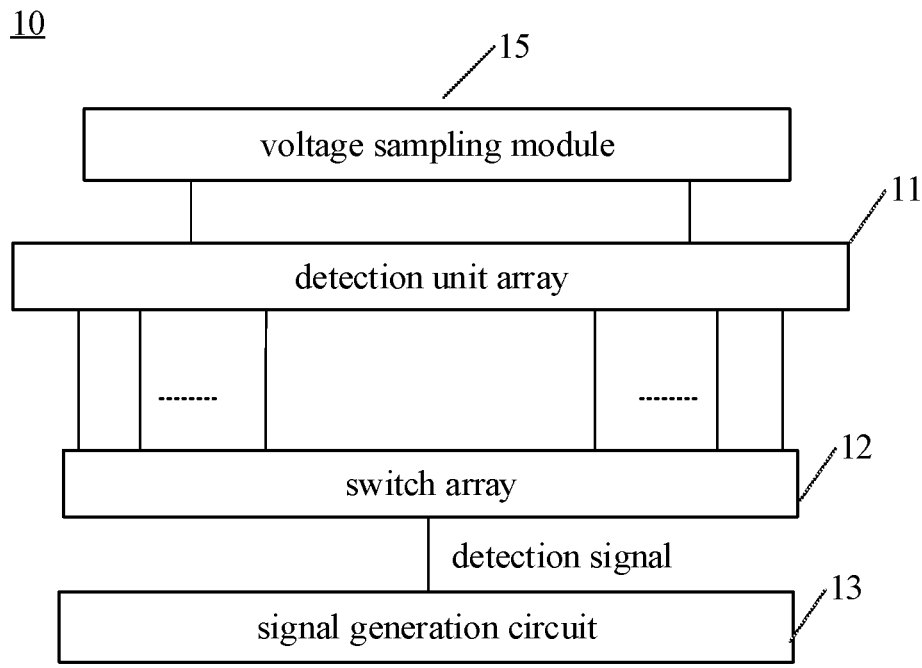
FIG. 1 is a schematic structure diagram of a power glitch signal detection circuit of an embodiment of the present application.

FIG. 1 is a schematic structure diagram of a power glitch signal detection circuit 10 of an embodiment in the present application.

With reference to FIG. 1, the power signal detection circuit 10 may include a voltage sampling module 15, a detection unit array 11, a switch array 12 and a signal generation circuit 13.

The voltage sampling module 15 is configured to acquire and output a sampling voltage of a power supply voltage.

The detection unit array 11 may include multiple metal oxide semiconductor (MOS) transistors with different threshold voltages. For example, the multiple MOS transistors have different threshold voltages respectively, wherein first terminals of the multiple MOS transistors are connected to the sampling voltage, and second terminals of the multiple MOS transistors are connected to the power supply voltage.

The switch array 12 may include multiple switches corresponding to the multiple MOS transistors, wherein the multiple switches may be configured to turn on or turn off paths between the multiple MOS transistors in the detection unit array 11 and the signal generation circuit 13. For example, a path between a MOS transistor with a specific threshold voltage in the detection unit array 11 and the signal generation circuit 13 is turned on, and paths between the other MOS transistors in the detection unit array and the signal generation circuit 13 are turned off, so as to make the signal generation circuit 13 receive a detection signal outputted by a drain terminal of the MOS transistor with the specific threshold voltage.

The signal generation circuit 13 may be configured to receive detection signals outputted by drain terminals of the multiple MOS transistors and generate target signals based on the detection signals. That is, the drain terminals of the multiple MOS transistor may be connected to the signal generation circuit 13 through the multiple switches respectively. For example, the drain terminals of the multiple MOS transistors are connected to one terminals of the multiple switches, and the other terminals of the multiple switches are connected to an input terminal of the signal generation circuit.

When a target switch in the switch array 12 is turned on and switches in the switch array 12 other than the target switch are turned off, the signal generation circuit 13 is configured to generate and output a target signal according to change of a voltage value of an output terminal of the target switch, and the target signal is used to indicate whether there is a power glitch signal on the power supply voltage or the ground voltage.

Because the multiple MOS transistors in the detection unit array 11 have different threshold voltages, the power glitch signal detection circuit 10 could detect whether there is a power glitch signal on the power supply voltage and whether there is a power glitch signal on the ground voltage via the detection unit array 11 and the switch array 12, based on different threshold voltages. That is to detect a power glitch signal with a specific amplitude via MOS transistors with different threshold voltages, thereby improving the applicability and sensitivity of the power glitch signal detection circuit 10.

In addition, the MOS transistors with different threshold voltages in the detection unit array 11 share the sampling voltage outputted by the voltage sampling module 15, which can reduce device overhead and chip area, thereby reducing the cost. In addition, the power glitch detection circuit 10 can be compatible with a digital (Complementary Metal-Oxide-Semiconductor Transistor, CMOS) process, which can enhance the portability of the glitch signal detection circuit.

In conclusion, the power glitch signal detection circuit 10 could detect a power glitch on the power supply voltage or the ground voltage, and the power glitch signal detection circuit has the advantages of high applicability, high sensitivity, low cost and strong portability.

Figure 2:
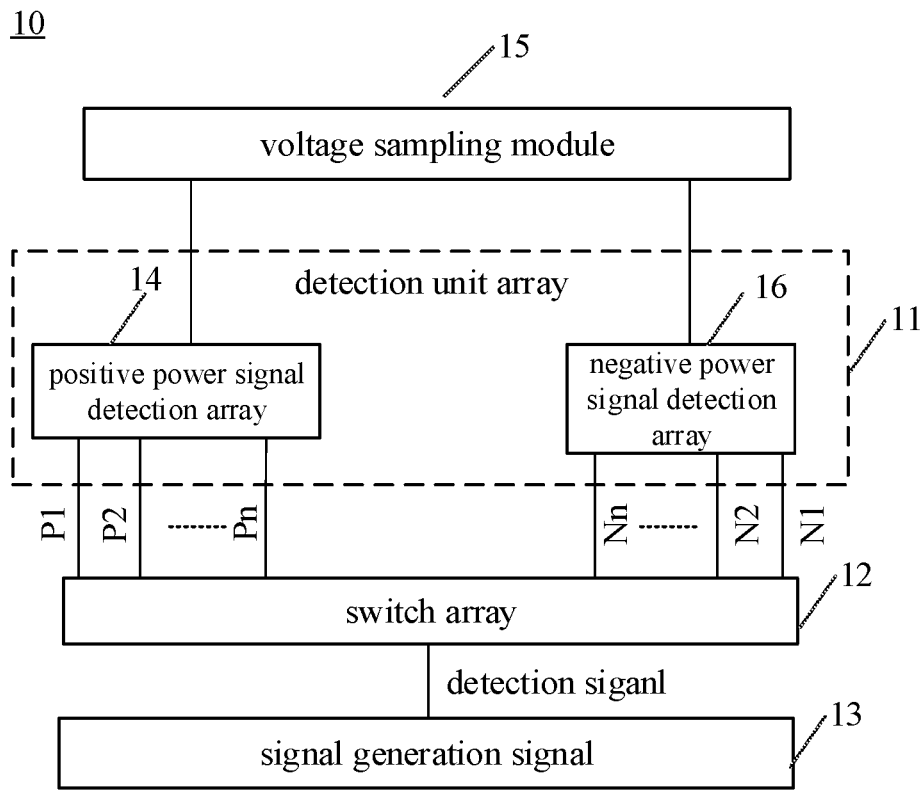
FIG. 2 is another schematic structure diagram of the power glitch signal detection circuit shown in FIG. 1.

FIG. 2 is another schematic structure diagram of the power glitch signal detection circuit 10 in FIG. 1.

With reference to FIG. 2, the detection unit array 11 may include a positive power glitch detection array 14 and/or a negative power glitch detection array 16, wherein the voltage sampling module 15 is configured to acquire the sampling voltage and output the sampling voltage to the positive power glitch detection array 14 and the negative power glitch detection array 16 respectively. In other words, the positive power glitch detection array 14 and the negative power glitch detection array 16 share the sampling voltage outputted by the voltage sampling module 15, in which way can reduce device overhead and chip area, thereby reducing the cost.

In some embodiments in the present application, the positive power glitch detection array 14 may include multiple first MOS transistors, wherein a gate terminal of each first MOS transistor in the multiple first MOS transistors is connected to the sampling voltage, and a source terminal of each first MOS transistor in the multiple first MOS transistors is connected to the power supply voltage. That is, the above-mentioned first terminals of the multiple MOS transistors include gate terminals of the multiple first MOS transistors, and second terminals of the multiple MOS transistors include source terminals of the multiple first MOS transistors. In other words, the first terminal of the first MOS transistor is the gate terminal of the first MOS transistor, and the second terminal of the first MOS transistor is the source terminal of the first MOS transistor.

Figure 3:
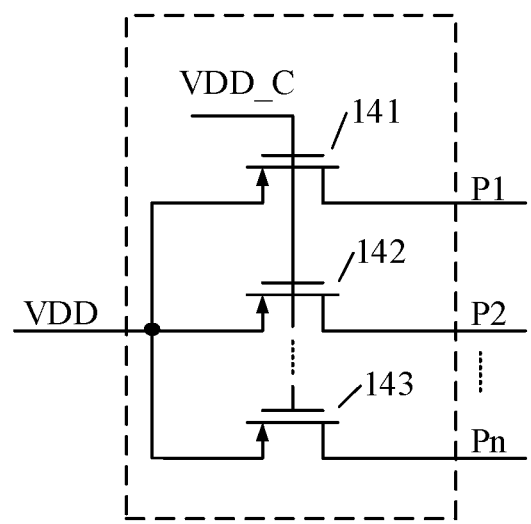
FIG. 3 is a schematic circuit diagram of a positive power signal detection array in the power glitch signal detection circuit shown in FIG. 1.

FIG. 3 is a schematic circuit diagram of the positive power signal detection array 14 in FIG. 2.

With reference to FIG. 3, the positive power glitch detection array 14 may include a first PMOS transistor 141, a second PMOS transistor 142 and a third PMOS transistor 143.

Among them, the sampling voltage VDD_C is connected to a gate terminal of the first PMOS transistor 141, a gate terminal of the second PMOS transistor 142 and a gate terminal of the third PMOS transistor 143 respectively; the power supply voltage VDD is connected to a source terminal of the first PMOS transistor 141, a source terminal of the second PMOS transistor 142 and a source terminal of the third PMOS transistor 143 respectively. The switch array 12 is connected to a drain terminal P1 of the first PMOS transistor 141, a drain terminal P2 of the second PMOS transistor 142 and a drain terminal P3 of the third PMOS transistor 143 respectively.

Further, with switches corresponding to the first PMOS transistor 141, the second PMOS transistor 142 and the third PMOS transistor 143 turned on or turned off, the signal generation circuit 13 may be controlled to receive a detection signal outputted by a drain terminal of a MOS transistor with a specific threshold voltage, For example, with a switch corresponding to the first PMOS transistor 141 turned on and a switch corresponding to the second PMOS transistor 142 and a switch corresponding to the third PMOS transistor 143 turned off, then the signal generation circuit 13 receives a detection signal outputted by the drain terminal P1 of the first PMOS transistor 141 and generate a target signal, based on the detection signal outputted by the drain terminal P1 of the first PMOS transistor 141 (which is based on change of a voltage of the drain terminal of the first PMOS transistor 141).

Taking the first PMOS transistor 141 as an example, when the power supply voltage VDD is attacked by a positive power glitch, that is when there is a positive power glitch signal on the power supply voltage VDD, then the power supply voltage VDD is greater than the sampling voltage VDD_C. When a difference between the power supply voltage VDD and the sampling voltage VDD_C is greater than a threshold voltage of the first PMOS transistor 141, then the first PMOS transistor 141 is turned on and the voltage of the drain terminal of the first PMOS transistor 141 increases, and the signal generation circuit 13 may generate a target signal according to change of the voltage of the drain terminal of the first PMOS transistor 141. When the ground voltage is attacked by a negative power glitch, that is when there is a negative power glitch signal on the ground voltage, because capacitive coupling effect of a capacitor in the voltage sampling module 15, a voltage of the gate terminal of the first PMOS 141 (which is the sampling voltage VDD_C) decreases, and the voltage VDD of the source terminal remains unchanged. When a difference between the power supply voltage VDD and the sampling voltage VDD_C is greater than the threshold voltage of the first PMOS transistor 141, then the first PMOS transistor 141 is turned on and the voltage of the drain terminal of the first PMOS transistor 141 increases, and the signal generation circuit 13 may generate a target signal according to change of the voltage of the drain terminal of the first PMOS transistor 141.

In some embodiments in the present application, the negative power glitch detection array 16 may include multiple third MOS transistors, wherein a source terminal of each third MOS transistor in the multiple third MOS transistors is connected to the sampling voltage, and a gate terminal of each third MOS transistor in the multiple third MOS transistors is connected to the power supply voltage. That is, the above-mentioned first terminals of the multiple MOS transistors include source terminals of the multiple third MOS transistors, and second terminals of the multiple MOS transistors include gate terminals of the multiple third MOS transistors. In other words, a first terminal of the third MOS transistor is a source terminal of the third MOS transistor, and a second terminal of the third MOS transistor is a gate terminal of the third MOS transistor.

Figure 4:
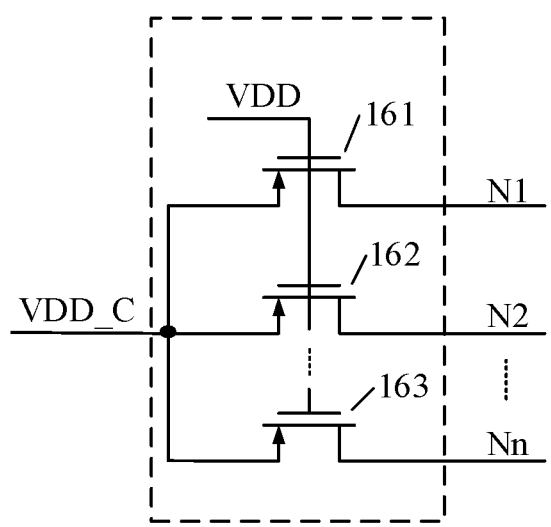
FIG. 4 is a schematic circuit diagram of a negative power signal detection array in the power glitch signal detection circuit shown in FIG. 1.

FIG. 4 is a schematic circuit diagram of the negative power signal detection array 16 in FIG. 2.

With reference to FIG. 4, the negative power glitch detection array 16 may include a first NMOS transistor 161, a second NMOS transistor 162 and a third NMOS transistor 163.

Among them, the power supply voltage VDD is connected to a gate terminal of the first NMOS transistor 161, a gate terminal of the second NMOS transistor 162 and a gate terminal of the third NMOS transistor 163 respectively; the sampling voltage VDD_C is connected to a source terminal of the first NMOS transistor 161, a source terminal of the second NMOS transistor 162 and a source terminal of the third NMOS transistor 163 respectively. The switch array 12 is connected to a drain terminal N1 of the first NMOS transistor 161, a drain terminal N2 of the second NMOS transistor 162 and a drain terminal N3 of the third NMOS transistor 163 respectively.

Then, with a switch corresponding to the first NMOS transistor 161, a switch corresponding to the second NMOS transistor 162 and a switch corresponding to the third NMOS transistor 163 turned on or turned off, the signal generation circuit may be controlled to receive a detection signal outputted by a drain terminal of a MOS transistor with a specific threshold voltage. For example, with the switch of the first NMOS transistor 161 turned on and the switch corresponding to the second PMOS transistor 162 and the switch corresponding to the third NMOS transistor 163 turned off, then the signal generation circuit 13 receives a detection signal outputted by the drain terminal N1 of the first NMOS transistor 161 and generate a target signal based on the detection signal outputted by the drain terminal N1 of the first NMOS transistor 161 (which is based on change of a voltage of the drain terminal of the first NMOS transistor 161).

Taking the first NMOS transistor 161 as an example, when the power supply voltage VDD is attacked by a negative power glitch, that is when there is a negative power glitch signal on the power supply voltage VDD, then the sampling voltage VDD_C is greater than the power supply voltage VDD. When a difference between and the sampling voltage VDD_C and the power supply voltage VDD is greater than a threshold voltage of the first NMOS transistor 161, then the first NMOS transistor 161 is turned on and the voltage of the drain terminal of the first NMOS transistor 161 increases, and the signal generation circuit 13 may generate a target signal according to change of the voltage of the drain terminal of the first NMOS transistor 161. When the ground voltage is attacked by a positive power glitch, that is when there is a positive power glitch signal on the ground voltage, with capacitive coupling effect of a capacitor in the voltage sampling module 15, a voltage of the source terminal of the first NMOS 161 (which is the sampling voltage VDD_C) increases, and the voltage VDD of the gate terminal remains unchanged. When a difference between the sampling voltage VDD_C and the power supply voltage VDD is greater than the threshold voltage of the first NMOS transistor 161, then the first NMOS transistor 161 is turned on and the voltage of the drain terminal of the first NMOS transistor 161 increases, and the signal generation circuit 13 may generate a target signal according to change of the voltage of the drain terminal of the first NMOS transistor 161.

In some embodiments of the present application, the switch array 12 may include multiple second MOS transistors, wherein the multiple second MOS transistors are corresponding to MOS transistors in the positive power glitch detection array 14, which are configured to turn on or turn off paths between drain terminals of the MOS transistors in the positive power glitch detection array 14 and the signal generation circuit 13.

For example, source terminals of the multiple second MOS transistors may be connected to drain terminals of the multiple first MOS transistors in the positive power glitch detection array 14 respectively, and a drain terminal of each second MOS transistor in the multiple second MOS transistors may be connected to the signal generation circuit 13. A gate terminal of a target MOS transistor in the multiple second MOS transistors may be configured to receive a first control signal (such as the ground voltage), and gate terminals of MOS transistors other than the target MOS transistor in the multiple second MOS transistors may be configured to receive a second control signal (such as the power supply voltage VDD).

Figure 5:
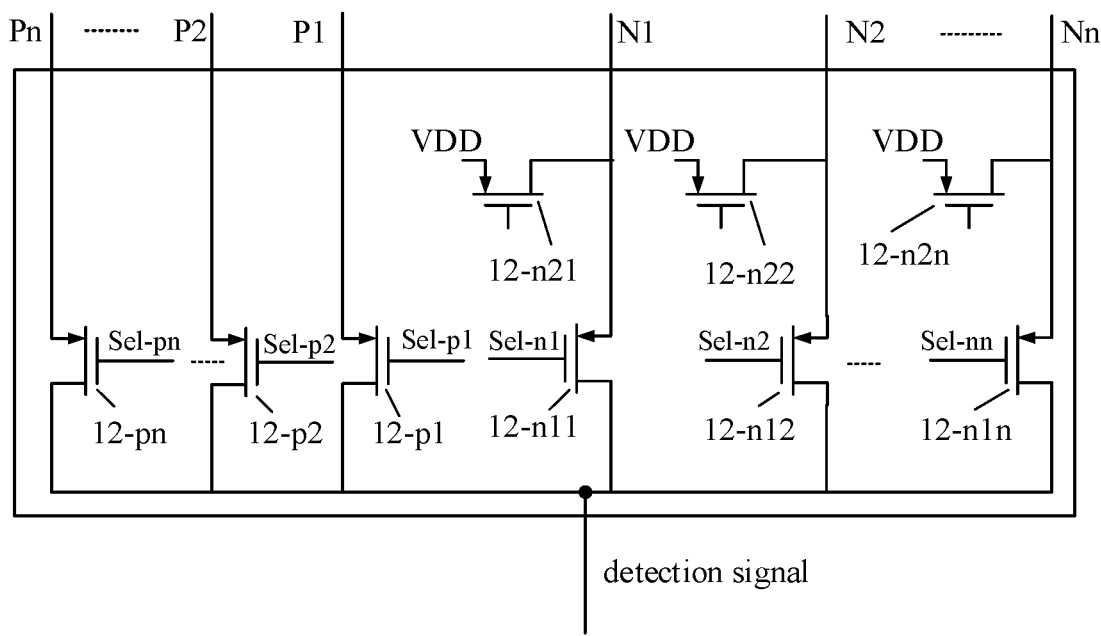
FIG. 5 is a schematic circuit diagram of a switch array in a power glitch signal detection circuit of an embodiment of the present application.

FIG. 5 is a schematic circuit diagram of the switch detection array in FIG. 2.

With reference to FIG. 5, as an exemplary embodiment, the switch array 12 may include a MOS transistor 12-p1 corresponding to the first PMOS transistor 141, a MOS transistor 12-p2 corresponding to the second PMOS transistor 142 and a MOS transistor 12-p3 corresponding to the third PMOS transistor 143.

Taking the MOS transistor 12-p1 as an example, a source gate of the MOS transistor 12-p1 is connected to the drain terminal of the first PMOS transistor 141, a gate terminal of the MOS transistor 12-p1 is configured to receive a control signal Sel-p1. If the MOS transistor 12-p1 is not the target MOS transistor (that is, the power glitch signal detection circuit does not detect a power glitch signal through the first PMOS transistor 141), then the gate terminal of the MOS transistor 12-p1 is configured to receive the power supply voltage VDD so as to turn off the MOS transistor 12-p1; if the MOS transistor 12-p1 is the target MOS transistor, then the gate terminal of the MOS transistor 12-p1 is configured to receive the ground voltage so as to turn on the MOS transistor 12-p1.

Assuming that there is a positive power glitch signal on the power supply voltage VDD or there is a negative power glitch signal on the ground voltage, then a voltage of the source terminal of the MOS transistor 12-p1 is the power supply voltage VDD. If the gate terminal of the MOS transistor 12-p1 is connected to the power supply voltage VDD, the MOS transistor 12-p1 is turned off, that is, the drain terminal of the first PMOS transistor 141 and the signal generation circuit 13 are turned off, then the power glitch signal detection circuit 10 does not detect a power glitch signal through the first PMOS transistor 141. If the gate terminal of the MOS transistor 12-*p*1 is connected to the ground voltage, the MOS transistor 12-*p*1 is turned on, that is, the drain terminal of the first PMOS transistor 141 and the signal generation circuit 13 are turned on, then the power glitch signal detection circuit 10 detects a power glitch signal through the first PMOS transistor 141.

In some embodiments of the present application, the switch array 12 may include multiple fourth MOS transistors, wherein the multiple fourth MOS transistors are corresponding to MOS transistors in the negative power glitch detection array 16, which are configured to control turn-on or turn-off of drain terminals of the MOS transistors in the negative power glitch detection array 16 and the signal generation circuit 13.

For example, source terminals of the multiple fourth MOS transistors may be connected to drain terminals of the multiple third MOS transistors in the negative power glitch detection array 16 respectively, and a drain terminal of each fourth MOS transistor in the multiple fourth MOS transistors may be connected to the signal generation circuit 13. A gate terminal of a target MOS transistors in the multiple fourth MOS transistors may be configured to receive a third control signal (such as the ground voltage), and gate terminals of MOS transistors other than the target MOS transistor in the multiple fourth MOS transistors may be configured to receive a fourth control signal (such as the power supply voltage VDD or the sampling voltage VDD_C).

For example, with continued reference to FIG. 5, the switch array 12 may include a MOS transistor 12-*n*11 corresponding to the first NMOS transistor 161, a MOS transistor 12-n12 corresponding to the second NMOS transistor 162 and a MOS transistor 12-*n*1*n* corresponding to the third NMOS transistor 163.

Taking the MOS transistor 12-*n*11 as an example, a source gate of the MOS transistor 12-*n*11 is connected to the drain terminal of the first PMOS transistor 161, a gate terminal of the MOS transistor 12-*n*11 is configured to receive a control signal Sel-n1. If the MOS transistor 12-*n*11 is not the target MOS transistor (that is, the power glitch signal detection circuit does not detect a power glitch signal through the first NMOS transistor 161), then the control signal Sel-n1 is used to control the MOS transistor 12-*n*11 to be tuned off; and if the MOS transistor 12-*n*11 is the target MOS transistor, then the control signal Sel-n1 is used to control the MOS transistor 12-*n*11 to be tuned on.

Assuming that there is a negative power glitch signal on the power supply voltage VDD or there is a positive power glitch signal on the ground voltage, that is, a voltage of the source terminal of the MOS transistor 12-*n*11 is the sampling voltage VDD_C. If the gate terminal of the MOS transistor 12-*n*11 is connected to the sampling voltage VDD_C, that is, a path between the drain terminal of the first NMOS transistor 161 and the signal generation circuit 13 is turned off, then the power glitch signal detection circuit 10 does not detect a power glitch signal through the first NMOS transistor 161. If the gate terminal of the MOS transistor 12-*n*11 is connected to the ground voltage, the MOS transistor 12-*n*11 is turned on, that is, the path between the drain terminal of the first NMOS transistor 161 and the signal generation circuit 13 is turned on, then the power glitch signal detection circuit 10 detects a power glitch signal through the first NMOS transistor 161.

Of course, the gate terminal of the MOS transistor 12-*n*11 may also be connected to the power supply voltage VDD.

It should be noted that, for a PMOS transistor, when VSG−VTH>0, then the PMOS is turned on; when VSG−VTH<0, then the PMOS is turned off. Therefore, for a switch in charge of turning off a MOS transistor path in the positive power glitch signal detection array 14, a voltages of a source terminal of the switch is VDD and a voltage of a gate terminal of the switch is also VDD, then the path is ensured to turn off And for a switch in charge of turning off a MOS transistor path in the negative power glitch signal detection array 16, a voltage of a source terminal of the switch is the sampling voltage VDD_C and a voltage of a gate terminal of the switch is VDD, then the switch can not be completely turned off, and the path is still turned on.

In some embodiments in the present application, the switch array may also include multiple fifth MOS transistors, which are configured to ensure non-target MOS transistors in the multiple fourth MOS transistors above are turned off.

For example, a source terminal of each fifth MOS transistor in the multiple fifth MOS transistors may be configured to receive the power supply voltage, and drain terminals of the multiple fifth MOS transistors may be connected to source terminals of the multiple fourth MOS transistors respectively. A gate terminal of a target MOS transistor in the multiple fifth MOS transistors may be configured to receive the power supply voltage, and gate terminals of MOS transistors other than the target MOS transistor in the multiple fifth MOS transistors can be configured to receive the ground voltage.

For example, with continued reference to FIG. 5, the multiple fifth MOS transistors may include a MOS transistor 12-*n*21 corresponding to the MOS transistor 12-*n*11, a MOS transistor 12-*n*22 corresponding to the MOS transistor 12-*n*11, and a MOS transistor 12-*n*2*n* corresponding to the MOS transistor 12-*n*1*n*.

Taking the MOS transistor 12-*n*21 as an example, a source terminal of the MOS transistor 12-*n*21 is connected to the power supply voltage VDD, a gate terminal of the MOS transistor 12-*n*21 is configured to receive a control signal Sel-n1. If the MOS transistor 12-*n*21 is not the target MOS transistor (that is, the power glitch signal detection circuit does not detect a power glitch signal through the first NMOS transistor 161), then the control signal Sel-n1 is used to control the MOS transistor 12-*n*21 to be turned on, thereby controlling the MOS transistor 12-*n*11 to be tuned off by the power supply voltage VDD outputted by a drain terminal; and if the MOS transistor 12-*n*21 is the target MOS transistor, then the control signal Sel-n1 is used to control the MOS transistor 12-*n*21 to be tuned off, thereby turning on the MOS transistor 12-*n*11 by the voltage of the drain terminal of the first NMOS transistor 161.

Assuming that there is a negative power glitch signal on the power supply voltage VDD or there is a positive power glitch signal on the ground voltage, that is, the voltage of the source terminal of the MOS transistor 12-*n*11 is the sampling voltage VDD_C. If the gate terminal of the MOS transistor 12-*n*11 is connected to the power supply voltage VDD and the gate terminal of the MOS transistor 12-*n*21 is connected to the ground voltage, then the MOS transistor 12-*n*11 is turned off, that is, the path between the drain terminal of the first NMOS transistor 161 and the signal generation circuit 13 is turned off, then the power glitch signal detection circuit 10 does not detect a power glitch signal through the first NMOS transistor 161. If the gate terminal of the MOS transistor 12-*n*11 is connected to the ground voltage and the gate terminal of the MOS transistor 12-n21 is connected to the power supply voltage, then the MOS transistor 12-n11 is turned on, that is, the path between the drain terminal of the first NMOS transistor 161 and the signal generation circuit 13 is turned on, then the power glitch signal detection circuit 10 may detect a power glitch signal through the first NMOS transistor 161.

Figure 6:
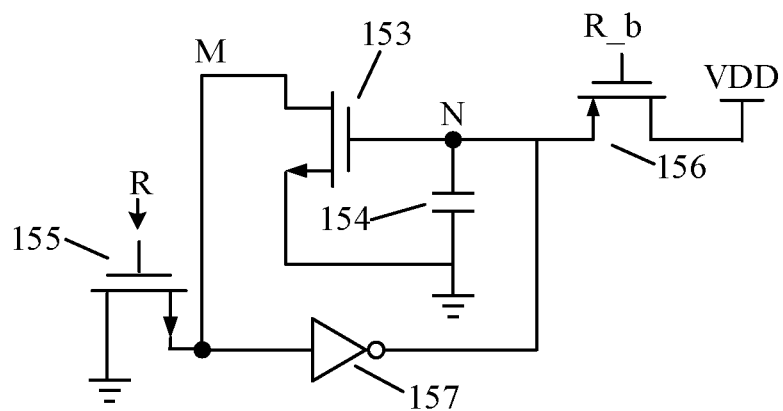
FIG. 6 and FIG. 7 are schematic circuit diagrams of a voltage sampling module in a power glitch signal detection circuit of an embodiment of the present application.
Figure 7:
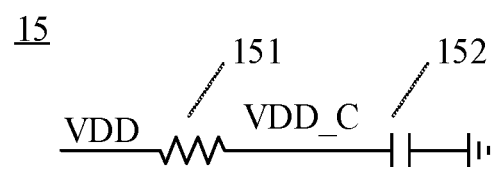

FIG. 6 and FIG. 7 are schematic circuit diagrams of the voltage sampling module in FIG. 1.

With reference to FIG. 6, the voltage sampling module 15 may include a first capacitor 154 and a sixth MOS transistor 153.

Among them, a gate terminal of the sixth MOS transistor 153 is connected to the ground voltage through the first capacitor 154, and a source terminal of the sixth MOS transistor 153 is connected to the ground voltage. When there is no power glitch signal on the power supply voltage and the ground voltage, then a voltage value of a drain terminal of the sixth MOS transistor 153 is the ground voltage, and a voltage value of the gate terminal of the sixth MOS transistor 153 is a sampling voltage sampled by the first capacitor 154. With the gate terminal of the sixth MOS transistor 153 connected to the capacitor 154, the power supply voltage sampled by the capacitor 154 that is not affected by the power glitch signal may be obtained. With the sixth MOS transistor 153 connected to the ground voltage, the voltage of the drain terminal of the sixth MOS transistor 153 may be reset so as to avoid the drain terminal of the sixth MOS transistor 153 to be in a high-impedance floating state. Thus, when there is no power glitch signal on the power supply voltage VDD and there is no power glitch signal on the ground voltage, the voltage of the drain terminal of the sixth MOS transistor 153 is the ground voltage, and the voltage of the gate terminal of the sixth MOS transistor 153 is the power supply voltage VDD sampled by the first capacitor 154, which is the sampling voltage VDD_C.

With continued reference to FIG. 6, the voltage sampling module 15 may also include a seventh MOS transistor 156, an eighth MOS transistor 155 and a first inverter 157.

Among them, the gate terminal of the sixth MOS transistor 153 is connected to the power supply voltage VDD through the seventh MOS transistor 156, the drain terminal of the sixth MOS transistor 153 is connected to the ground voltage through the eighth MOS transistor 155, and the drain terminal of the sixth MOS transistor 153 is connected to the gate terminal of the sixth MOS transistor 153 through the first inverter 157.

Further, a control signal used to control the seventh MOS transistor 156 and a control signal used to control the eighth MOS transistor 155 may be a set of inverted signals. For example, a gate terminal of the eighth MOS transistor 155 is configured to receive a first signal R and a gate terminal of the seventh MOS transistor 156 is configured to receive an inverted signal R_b of the first signal R.

For example, when the first signal R is at a high level, the seventh MOS transistor 156 and the eighth MOS transistor 155 are both turned on, that is, the power supply voltage charges the first capacitor 154 through the seventh MOS transistor 156 so that a first voltage of the gate terminal N of the sixth MOS transistor 153 is made to be "1"; and the drain terminal M of the sixth MOS transistor 153 is connected to the ground through the eighth MOS transistor 155 so that a second voltage of the drain terminal M of the sixth MOS transistor 153 is made to be "0". Then, when the first signal R is at a low level, the seventh MOS transistor 156 and the eighth MOS transistor 155 are both turned off, then the first voltage of the gate terminal N of the sixth MOS transistor 153 is maintained at "1" and the second voltage of the drain terminal M of the sixth MOS transistor 153 is maintained at "0".

That is, the voltage of the gate terminal N of the sixth MOS transistor 153 can be increased to VDD and the voltage of the drain terminal M of the first MOS transistor 153 can be decreased to GND, through the seventh MOS transistor 156 and the eighth MOS transistor 155.

By controlling the first inverter 157, it can be ensured that the voltage of the drain terminal of the sixth MOS transistor 153 is "0", thereby ensuring the performance of the power glitch signal detection circuit 10. Even if the voltage of the drain terminal of the sixth MOS transistor 153 increases, the first inverter 157 can also ensure that the voltage of the drain terminal of the sixth MOS transistor 153 is restored to "0". In addition, through the first inverter 157, current leakage of the first capacitor 154 can also be avoided, thereby ensuring that the voltage value of the capacitor is remained at the power supply voltage. Thus, the power glitch signal detection circuit can detect in real time whether the power supply voltage or the ground voltage is attacked by a power glitch.

In addition, the sixth MOS transistor 153, a MOS transistor in the detection unit array 11 and the first inverter 157 may be configured to form a latch. The seventh MOS transistor 156 and the eighth MOS transistor 155 are enable circuits of the latch. In other words, the sixth MOS transistor 153, the MOS transistor in the detection unit array 11, the first inverter 157, the seventh MOS transistor 156 and the eighth MOS transistor 155 may form a latch with enable control.

A voltage sampling module formed with a capacitor and a MOS transistor could implement sampling the power supply voltage, and the voltage sampling module could form a latch with the MOS transistor in the detection unit array 11, that is, a power glitch signal detection circuit in the present application could be directly made with the existing latch, which could further improve applicability.

With reference to FIG. 7, the voltage sampling module 15 may include a resistor 151 and a second capacitor 152, wherein a terminal of the resistor 151 is connected to the power supply voltage, and the other terminal of the resistor is connected to the ground voltage through the second capacitor 152.

Figure 8:
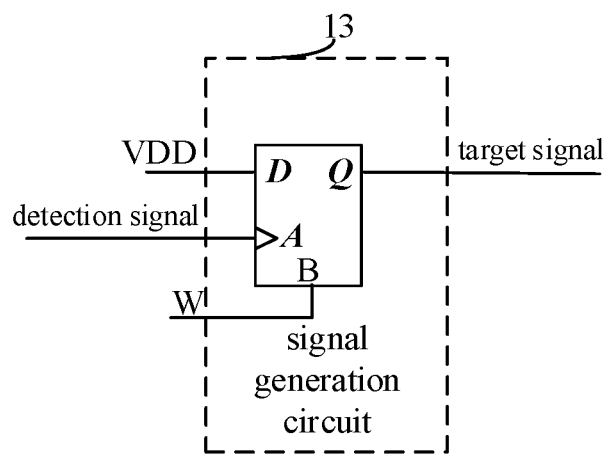
FIG. 8 is a schematic structure diagram of a signal generation circuit in a power glitch signal detection circuit of an embodiment of the present application.

FIG. 8 is a schematic structure diagram of a signal generation circuit 13 of an embodiment of the present application.

With reference to FIG. 8, the signal generation circuit 13 may be a D trigger.

For example, a reset terminal B of the D trigger is connected to a reset signal W. For example, the reset signal W may be the first signal R; a terminal D of the D trigger is connected to the VDD; a detecting terminal A of the D trigger is connected to an output terminal of the switch array 12, which is configured to receive a detection signal; and a output terminal Q of the D trigger is configured to output a target signal (which is an alarm signal). Of course, the signal generation circuit 13 may also be other devices, such as a comparator. Optionally, the target signal may also be a differential signal.

It should be understood that the MOS transistor above may be a Metal-Oxide-Semiconductor Field-Effect Transistor (MOSFET). Such as N-type MOS transistor (NMOSFET) and P-type MOS transistor (PMOSFET). When N-type MOS transistor and P-type MOS transistor are used as switches, the N-type MOS transistor (a MOS transistor with a substrate PN junction pointing inward or a MOS transistor with a current flowing out) is turned on when the gate terminal is connected to the high voltage, and is turned off when connected to the low voltage; the P-type MOS transistor (a MOS transistor with a PN junction pointing outward or a MOS transistor with a current flowing in) is turned off when the gate terminal is connected to a high voltage and turned on when the gate terminal is connected to a low voltage.

It should also be understood that, FIG. 1 to FIG. 8 are only exemplary embodiments of the present application, and the present application is not limited to such embodiments.

For example, the power signal detection circuit 10 may also include a threshold decision module.

For example, the output terminal of the switch array 12 is connected to the signal generation circuit 13 through the threshold decision module, and the threshold decision module is configured to amplify a signal outputted by the switch array 12 and to transmit the amplified signal to the signal generation circuit 13. For example, the threshold decision module may include a second inverter and a third inverter, wherein the output terminal of the switch array 12 is connected to a terminal of the third inverter through the second inverter, and the other terminal of the third inverter is connected to the signal generation signal 13. Among them, an inverting threshold of the second inverter may be less than that of the third inverter. For example, the inverting threshold of the second inverter is 0.3, and the inverting threshold of the third inverter is 0.8, that is, reducing the inverting threshold of the second inverter to increase the sensitivity of the power glitch signal detection circuit 10, and amplifying the inverting threshold of the third inverter to ensure the stability of the power glitch signal detection circuit 10. It should be understood that 0.3 and 0.8 are only exemplary embodiments, and the inverting threshold of the second inverter and the inverting threshold of the third inverter are not specifically limited in the present application. A power glitch signal with a lower amplitude can be detected in cooperation with the threshold decision module, which can further increase the sensitivity of the power glitch signal circuit 10.

Again for example, the number of the MOS transistor in the switch array 12 and the detection unit array 11 in the accompanying drawing is only an exemplary embodiment, which should not be understood as limit to the present application. Those skilled in the art can configure multiple MOS transistors according to an actual demand.

The present application also provides a security chip, the security chip may include the above-mentioned power glitch signal detection circuit. For example, the security chip may be a fingerprint sensor chip or a processor chip, etc. The present application also provides an electronic apparatus, wherein the electronic apparatus may include the above-mentioned security chip. For example, a portable or mobile computer device such as a smart phone, a notebook, a tablet computer or a game device, or another electronic device such as an electronic database, an automobile or an automated teller machine (ATM), which is not limited in the embodiments of the present application.

Those skilled in the art may be aware that the units and circuits of the examples described in combination with the embodiments disclosed herein can be implemented by electronic hardware or a combination of computer software and electronic hardware. Whether these functions are executed by hardware or software depends on the specific application and constraints of design of the technical solution. Professionals can use different methods for each specific application to implement the described functions, but such implementation should not be considered beyond the scope of this application.

In several embodiments provided in the present application, it should be understood that the disclosed circuits, branches, and units may be implemented in other ways. For example, the branches described above are schematic. For example, the division of the units is only a division of logical functions, and there may be other divisions in actual implementation. For example, multiple units can be combined or integrated into one branch, or some features can be ignored or not implemented.

If the integrated unit is implemented in the form of a software functional unit and sold or used as an independent product, it can be stored in a computer readable storage medium. Based on such understanding, the technical solution provided by the present essentially or the part that contributes to prior art or the part of the technical solution can be embodied in the form of a software product, and the computer software product is stored in a storage medium, including instructions that can be used to make a computer device (which may be a personal computer, a server, or a network device, etc.) execute all or part of the steps of the method described in each embodiment of the present application. And above-mentioned storage media include: U disk, portable hard disk, Read-Only Memory (ROM), Random Access Memory (RAM), magnetic disk or optical disk and other media that can store program code.

The above description is only specific embodiments of the present application, but the protection scope of the present disclosure is not limited thereto, any skilled who is familiar with this art could readily conceive variations or substitutions within the disclosed technical scope disclosed by the present application, and these variations or substitutions shall be encompassed in the protection scope of the present application. Thus, the protection scope of the present application shall be subjected to the protection scope of the claims.

What is claimed is:

1. A power glitch signal detection circuit, comprising:
    a voltage sampling module, configured to acquire and output a sampled voltage of a power supply voltage;
    a detection unit array, including multiple metal oxide semiconductor (MOS) transistors, wherein first terminals of the multiple MOS transistors are connected to the sampling voltage, and second terminals of the multiple MOS transistors are connected to the power supply voltage, wherein the multiple MOS transistors have different threshold voltages respectively;
    a switch array, including multiple switches corresponding to the multiple MOS transistors; and
    a signal generation circuit, wherein drain terminals of the multiple MOS transistors are connected to the signal generation circuit through the multiple switches respectively;
    wherein when a target switch in the multiple switches is turned on and switches in the multiple switches other than the target switch are turned off, the signal generation circuit is configured to generate and output a target signal according to change of a voltage value of an output of the target switch, and the target signal is used to indicate whether there is a power glitch signal on the power supply voltage or the ground voltage.

2. The power glitch signal detection circuit according to claim 1, wherein the multiple MOS transistors comprise:
    multiple first MOS transistors, wherein a first terminal of the first MOS transistor is a gate terminal of the first MOS transistor, and a second terminal of the first MOS transistor is a source terminal of the first MOS transistor.

3. The power glitch signal detection circuit according to claim 2, wherein the switch array comprises:
multiple second MOS transistors,
wherein source terminals of the multiple second MOS transistors are connected to drain terminals of the multiple first MOS transistors respectively, and drain terminals of the multiple second MOS transistors are connected to the signal generation circuit;
wherein a gate terminal of a target MOS transistor in the multiple second MOS transistors is configured to receive the ground voltage; and
gate terminals of MOS transistors in the multiple second MOS transistors other than the target MOS transistor are configured to receive the power supply voltage.

4. The power glitch signal detection circuit according to claim 1, wherein the multiple MOS transistor comprises:
multiple third MOS transistors,
wherein a first terminal of the third MOS transistor is a source terminal of the third MOS transistor, and a second terminal of the third MOS transistor is a gate terminal of the third MOS transistor.

5. The power glitch signal detection circuit according to claim 4, wherein the switch array comprises:
multiple fourth MOS transistors,
wherein source terminals of the multiple fourth MOS transistors are connected to drain terminals of the multiple third MOS transistors respectively, and drain terminals of the multiple fourth MOS transistors are connected to the signal generation circuit;
wherein a gate terminal of a target MOS transistor in the multiple fourth MOS transistors is configured to receive the ground voltage; and
gate terminals of MOS transistors in the multiple fourth MOS transistors other than the target MOS transistor are configured to receive the power supply voltage or the sampled voltage.

6. The power glitch signal detection circuit according to claim 5, wherein the switch array further comprises:
multiple fifth MOS transistors,
wherein source terminals of the multiple fifth MOS transistors are configured to receive the power supply voltage, and drain terminals of the multiple fifth MOS transistors are connected to the source terminals of the multiple fourth MOS transistors;
wherein a gate terminal of a target MOS transistor in the multiple fifth MOS transistors is configured to receive the power supply voltage; and
gate terminals of MOS transistors in the multiple fifth MOS transistors other than the target MOS transistor are configured to receive the ground voltage.

7. The power glitch signal detection circuit according to claim 1, wherein the voltage sampling module comprises:
a first capacitor and a sixth MOS transistor,
wherein a gate terminal of the sixth MOS transistor is connected to the ground voltage through the first capacitor, and a source terminal of the sixth MOS transistor is connected to the ground voltage.

8. The power glitch signal detection circuit according to claim 7, wherein the voltage sampling module further comprises:
a seventh MOS transistor, an eight MOS transistor and a first inverter, wherein the gate terminal of the sixth MOS transistor is connected to the power supply voltage through the seventh MOS transistor, a drain terminal of the sixth MOS transistor is connected to the ground voltage through the eighth MOS transistor, and the drain terminal of the sixth MOS transistor is connected to the gate terminal of the sixth MOS transistor through the first inverter.

9. The power glitch signal detection circuit according to claim 1, wherein the voltage sampling module comprises:
a resistor and a second capacitor,
wherein a terminal of the capacitor is connected to the power supply voltage, and the other terminal of the capacitor is connected to the ground voltage through the second capacitor.

10. The power glitch signal detection circuit according to claim 1, wherein the signal output module is a D trigger.

11. A security chip, comprising a power glitch signal detection circuit, wherein the power glitch signal detection circuit comprises:
a voltage sampling module, configured to acquire and output a sampled voltage of a power supply voltage;
a detection unit array, including multiple MOS transistors, wherein first terminals of the multiple MOS transistors are connected to the sampling voltage, and second terminals of the multiple MOS transistors are connected to the power supply voltage, wherein the multiple MOS transistors have different threshold voltages respectively;
a switch array, including multiple switches corresponding to the multiple MOS transistors; and
a signal generation circuit, wherein drain terminals of the multiple MOS transistors are connected to the signal generation circuit through the multiple switches respectively;
wherein when a target switch in the multiple switches is turned on and switches in the multiple switches other than the target switch are turned off, the signal generation circuit is configured to generate and output a target signal according to change of a voltage value of an output of the target switch, and the target signal is used to indicate whether there is a power glitch signal on the power supply voltage or the ground voltage.

12. The security chip according to claim 11, wherein the multiple MOS transistors comprise:
multiple first MOS transistors,
wherein a first terminal of the first MOS transistor is a gate terminal of the first MOS transistor, and a second terminal of the first MOS transistor is a source terminal of the first MOS transistor.

13. The security chip according to claim 12, wherein the switch array comprises:
multiple second MOS transistors,
wherein source terminals of the multiple second MOS transistors are connected to drain terminals of the multiple first MOS transistors respectively, and drain terminals of the multiple second MOS transistors are connected to the signal generation circuit;
wherein a gate terminal of a target MOS transistor in the multiple second MOS transistors is configured to receive the ground voltage; and
gate terminals of MOS transistors in the multiple second MOS transistors other than the target MOS transistor are configured to receive the power supply voltage.

14. The security chip according to claim 11, wherein the multiple MOS transistor comprises:
multiple third MOS transistors, wherein a first terminal of the third MOS transistor is a source terminal of the third MOS transistor, and a second terminal of the third MOS transistor is a gate terminal of the third MOS transistor.

15. The security chip according to claim 14, wherein the switch array comprises:
multiple fourth MOS transistors,
wherein source terminals of the multiple fourth MOS transistors are connected to drain terminals of the multiple third MOS transistors respectively, and drain terminals of the multiple fourth MOS transistors are connected to the signal generation circuit;
wherein a gate terminal of a target MOS transistor in the multiple fourth MOS transistors is configured to receive the ground voltage; and
gate terminals of MOS transistors in the multiple fourth MOS transistors other than the target MOS transistor are configured to receive the power supply voltage or the sampled voltage.

16. The security chip according to claim 15, wherein the switch array further comprises:
multiple fifth MOS transistors,
wherein source terminals of the multiple fifth MOS transistors are configured to receive the power supply voltage, and drain terminals of the multiple fifth MOS transistors are connected to the source terminals of the multiple fourth MOS transistors;
wherein a gate terminal of a target MOS transistor in the multiple fifth MOS transistors is configured to receive the power supply voltage; and
gate terminals of MOS transistors in the multiple fifth MOS transistors other than the target MOS transistor are configured to receive the ground voltage.

17. The security chip according to claim 11, wherein the voltage sampling module comprises:
a first capacitor and a sixth MOS transistor,
wherein a gate terminal of the sixth MOS transistor is connected to the ground voltage through the first capacitor, and a source terminal of the sixth MOS transistor is connected to the ground voltage.

18. The security chip according to claim 17, wherein the voltage sampling module further comprises:
a seventh MOS transistor, an eight MOS transistor and a first inverter,
wherein the gate terminal of the sixth MOS transistor is connected to the power supply voltage through the seventh MOS transistor, a drain terminal of the sixth MOS transistor is connected to the ground voltage through the eighth MOS transistor, and the drain terminal of the sixth MOS transistor is connected to the gate terminal of the sixth MOS transistor through the first inverter.

19. The security chip according to claim 11, wherein the voltage sampling module comprises:
a resistor and a second capacitor,
wherein a terminal of the capacitor is connected to the power supply voltage, and the other terminal of the capacitor is connected to the ground voltage through the second capacitor.

20. An electronic apparatus, comprising:
a security chip, comprising a power glitch signal detection circuit, wherein the power glitch signal detection circuit comprises:
a voltage sampling module, configured to acquire and output a sampled voltage of a power supply voltage;
a detection unit array, including multiple MOS transistors, wherein first terminals of the multiple MOS transistors are connected to the sampling voltage, and second terminals of the multiple MOS transistors are connected to the power supply voltage, wherein the multiple MOS transistors have different threshold voltages respectively;
a switch array, including multiple switches corresponding to the multiple MOS transistors; and
a signal generation circuit, wherein drain terminals of the multiple MOS transistors are connected to the signal generation circuit through the multiple switches respectively;
wherein when a target switch in the multiple switches is turned on and switches in the multiple switches other than the target switch are turned off, the signal generation circuit is configured to generate and output a target signal according to change of a voltage value of an output of the target switch; and
a processor, wherein the processor is configured to receive the target signal sent by the security ship, and the target signal is used to indicate whether there is a power glitch signal on the power supply voltage or the ground voltage.

* * * * *